United States Patent [19]
Ihara et al.

[11] Patent Number: 5,919,735
[45] Date of Patent: *Jul. 6, 1999

[54] HIGH TEMPERATURE SUPERCONDUCTOR

[75] Inventors: Hideo Ihara; Akira Iyo, both of Tsukuba, Japan

[73] Assignee: Agency of Industrial Science and Technology, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/548,975

[22] Filed: Oct. 27, 1995

[30] Foreign Application Priority Data

Nov. 4, 1994 [JP] Japan ................................. 6-270817
Dec. 6, 1994 [JP] Japan ................................. 6-302255

[51] Int. Cl.$^6$ ................................................ C04B 35/45
[52] U.S. Cl. ........................ 505/125; 505/120; 505/783; 505/776
[58] Field of Search .................................. 505/120, 121, 505/125, 124, 782, 783, 754, 776; 252/521, 518.1

[56] References Cited

U.S. PATENT DOCUMENTS 5,444,039  8/1995  Isawa et al. ............................. 505/125
5,550,105  8/1996  Edwards et al. ......................... 505/120

OTHER PUBLICATIONS

Ihara et al "New High-Tc Superconductor Family of Cu-based $Cu_{1-x}Ba_2Ca_{n-1}Cu_nO_{2n+4=8}$ . . . ", JJAP, vol. 33, Part 2, (4A) 503–506, Apr. 1994.

Ihara et al "New high-Tc superconductor $Ag_{1-x}Cu_xBa_2Ca_{n-1}u_nO_{2n+3-s}$ family with Tc z117K" Jap Journ. of App. Phys, Part 2, 33(3A), Apr. 1994, L300–L303.

Ihara et al "New high-Tc superconductor families of $Ag_{1-x}u_xBa_2Ca_{n-1}Cu_nO_{2n+4-y}$. . . " Physica C, Pt. 2, vol. 235–240, Jul. 1994, pp. 981–982.

Ihara "More than halfway to room temperature superconductors . . . " Denshi Gijutsu Sogo Konkyusho Iho, 58(6), Nov. 1994, pp. 448–452.

Subramanian et al "Synthesis and superconducting Properties of $(tL_{1-x}Bi_x)Sr_2Ca_2Cu_3O_y$," Mat. Res. Bull. vol. 25 pp. 101–106, Jan. 1990.

Sun et al "$T_c$ enhancement of $HgBa_2Ca_2Cu_3O_{8+s}$ by Tl Substitution" Physics Letters A, 192(1994) Aug, pp. 122–124.

*Primary Examiner*—Mark Kopec
*Attorney, Agent, or Firm*—Venable; Robert J. Frank; Ashley J. Wells

[57] ABSTRACT

A high temperature superconductor which has a layered crystal structure, which has a superconducting transition temperature, Tc, of 110 K or more, and which has a composition expressed by:

$$Cu_{1-z}M'_zAe_2Ca_{x-1}Cu_xO_y,$$

where M' is at least one element selected from the group consisting of (a) trivalent ions of Tl, and (b) polyvalent ions of Mo, W, and Re, where Ae is at least one of Ba and Sr, where x ranges from 1 to 10, where y ranges from 2x+1 to 2x+4, and where z ranges from $0<z \leq 0.5$.

4 Claims, 8 Drawing Sheets

HIGH TEMPERATURE SUPERCONDUCTOR

BACKGROUND OF THE INVENTION

1. Field of the Invention

This invention relates to a high temperature superconductor. More specifically, it relates to a superconductor usable at the temperature of liquid nitrogen or a higher temperature, and a superconductor usable at the temperature of liquid nitrogen or a higher temperature, being low in anisotropy, and having a high critical current density, and a process for their preparation.

2. Description of the Prior Art

Known copper oxide superconductors having superconducting transition temperatures, Tc's, of 110 K or more are Tl and Hg type copper oxide superconductors. These copper oxide superconductors have high Tc values, but they contain harmful and rare elements such as Tl or Hg. Thus, they posed marked problems, such as the necessity for anti-pollution measures, the need for cost reduction, and difficulty in securing such rare resources.

With those conventional superconductors, let the coherence length in the intrafacial direction of the $CuO_2$ plane (ab plane) in its crystal structure be $\xi ab$, the coherence length in a direction perpendicular to the $CuO_2$ plane (c-axis direction) be $\xi c$, and the anisotropy $\gamma$ of the superconducting properties be expressed as $\xi ab/\xi c$. Then, $\gamma=5$ for the composition $YBa_2Cu_3O_{7-y}$ with the lowest anisotropy, and this value was considerably high. Thus, those conventional oxide superconductors have had short coherence lengths in the c-axis direction perpendicular to the $CuO_2$ plane, which, in turn, have made critical current densities under high temperature, high magnetic field conditions small. These facts have been an obstacle to their practical use.

SUMMARY OF THE INVENTION

This invention has been accomplished in the light of the foregoing situations, and is aimed at resolving the aforementioned harmfulness, high anisotropy of superconducting properties, short coherence lengths, and decreases in current densities under high magnetic field conditions.

In other words, an object of the present invention is to provide a high temperature superconductor free from harmful elements or low in their content, and having a superconducting transition temperature, Tc, of 110 K or more.

Another object of the present invention is to provide a high temperature superconductor having, in addition to the above-described advantages, a large coherence length in the c-axis direction, a high current density under a high magnetic field, and low anisotropy.

Still another object of the present invention is to provide a process for preparing such high temperature superconductors.

To solve the aforementioned problems, the present invention uses an oxide of the alkaline earth metal element Ba, Sr or Ca with copper as a matrix, and adds a monovalent alkali metal element or Cu, Ag or Au, or divalent Cu, Hg, Pb or Cd, or trivalent Y or lanthanum elements for introduction of a carrier to form a layered copper oxide, thereby realizing a high temperature superconductor having a superconducting transition temperature, Tc, of 110 K or more.

The present invention also uses an oxide of the alkaline earth metal element Ba, Sr or Ca with copper as a matrix, and adds various elements for introduction of a carrier and stabilization of the structure to form a layered copper oxide with as short a c-axis as possible, thereby realizing a low anisotropy, high temperature superconductor having a superconducting transition temperature, Tc, of 110 K or more, and low anisotropy of superconducting properties.

The above-mentioned high temperature superconductor or low anisotropy, high temperature superconductor is prepared by use of a non-equilibrium method such as high pressure synthesis, hot pressing, HIP (high temperature isostatic processing), sputtering or laser abrasion. The target in sputtering may be either a sintered material of the same composition as a film to be produced, or those targets for the respective elements which are to be laminated for atomic layers. Sputtering or laser abrasion is performed, for example, using an $SrTiO_3$ (100 plane) substrate at a substrate temperature of 300 to 600° C. and an oxygen partial pressure of 0.001 to 1 Torr.

That is, the high temperature superconductor according to the present invention is characterized by having a composition expressed as the following formula (1)

$$MAe_2Ca_{x-1}Cu_xO_y$$

where M is at least one member selected from the group consisting of monovalent ions of Cu, Ag and Au, divalent ions of Cu, Hg and Pb, and trivalent ions of Tl, Bi, Y and lanthanide elements, Hg or Tl does not exist singly, Ae is at least one of Ba and Sr, x=1 to 10, and y=2x to 2x+4,
having a layered crystal structure, and having a superconducting transition temperature, Tc, of 110 K or more.

The high temperature superconductor according to the present invention is characterized by having a composition expressed as the following formula (2)

$$(M,Ae)_3Ae'_{x-1}Cu_xO_y$$

where M is at least one member selected from the group consisting of monovalent ions of Cu, Ag and Au, divalent ions of Cu, Hg and Pb, and trivalent ions of Tl, Bi, Y and lanthanide elements, Hg or Tl does not exist singly, Ae is a mixture of Ba and Sr, Ae' is a mixture of Ba, Sr and Ca, x=1 to 10, and y=2x to 2x+4,
having a layered crystal structure, and having a superconducting transition temperature, Tc, of 110 K or more.

The low anisotropy, high temperature superconductor of the present invention is characterized by having a composition expressed as the following formula (3)

$$Cu_{1-z}M_zAe_2Ca_{x-1}Cu_xO_y$$

where M is at least one member selected from the group consisting of monovalent ions of Li, Na, K, Rb, Cs, Ag and Au, divalent ions of Hg, Cd and Pb, trivalent ions of Tl, Bi, Y and lanthanide elements, and polyvalent ions of Cr, Mn, Fe, Co, Ni, Mo, Tc, Ru, Rh, Pd, W, Re, Os, Ir and Pt, Ae is at least one of Ba, Sr and $Ba_{1-w}Sr_w$, x=1 to 10, and y=2x+1 to 2x+4, z=0 to 0.5, and w=0 to 1.0,
having a layered crystal structure, and having a superconducting transition temperature, Tc, of 110 K or more, and by being constituted such that when letting $\xi ab$ denote the coherence length in the intrafacial direction of the $CuO_2$ plane (ab plane) in the crystal structure, and $\xi c$ the coherence length in a direction perpendicular to the $CuO_2$ plane (c-axis direction), the anisotropy $\gamma$ of the superconducting properties, expressed as $\xi ab/\xi c$, is 5 or less.

In the formula (3), it is preferred that Ae is Ba, z=0 to 0.3, and x=2 to 6. Further preferably, the low anisotropy, high temperature superconductor has a composition expressed substantially as $CuBa_2Ca_3Cu_4O_{12-n}$ where n=0 to 4.

In the formula (3), it is also preferred that M is Re, Ae is Ba, and x=2 to 6. Further preferably, the low anisotropy, high temperature superconductor has a composition expressed substantially as $(Cu,Re)Ba_2Ca_3Cu_4O_{12-n}$ where n=0 to 4.

In the formula (3), it is also preferred that M is Ag, Ae is Ba, and x=2 to 6. Further preferably, the low anisotropy, high temperature superconductor has a composition expressed substantially as $(Cu,Ag)Ba_2Ca_3Cu_4O_{12-n}$ where n=0 to 4.

In the formula (3), it is also preferred that M is Ag, Ae is Sr, and x=2 to 6. Further preferably, the low anisotropy, high temperature superconductor has a composition expressed substantially as $AgSr_2Ca_3Cu_4O_{12-n}$ where n=0 to 4.

The process of the present invention is a process for preparing the above-described high temperature superconductor or low anisotropy, high temperature superconductor, which comprises mixing the starting powders to form a mixture of a desired composition, and subjecting the powder mixture to a high pressure, high temperature synthesis involving a pressure of 100 kg/cm$^2$ to 100,000 kg/cm$^2$, and a temperature of 300 to 1,300° C.

In the above process, the starting powders may be powders formed by pulverizing sintered high temperature superconductors that have been prepared.

The process for preparation of the present invention is also characterized by using a target comprising a molded high temperature superconductor or its constituent elements, and forming a high temperature superconductor film from the target on a substrate by sputtering.

The process for preparation of the present invention is further characterized by using a molded high temperature superconductor as a target, and forming a high temperature superconductor film from the target on a substrate by laser abrasion.

In the present invention, an oxide of a rare earth element with copper that can become a superconductor, such as $Ba_2Ca_{x-1}Cu_xO_{2x+1}$ or $Sr_2Ca_{x-1}Cu_xO_{2x+1}$, is used as a matrix, and a carrier is introduced using a mono- to trivalent element to realize a high temperature superconductor. By making the number of copper layers large, its superconducting transition temperature Tc can be raised. Also by making the layer of monovalent ions, the layer of divalent or trivalent ions, or the layer of mono- to trivalent ions mixed a single layer, and making this layer a defect layer with many vacancies, it becomes possible to decrease the interlayer distance of the copper layers and increase the critical current density.

In the present invention, moreover, $Cu_{1-z}Ba_2Ca_{x-1}Cu_xO_{2x+4-n}$, $Cu_{1-z}Sr_2Ca_{x-1}Cu_xO_{2x+4-n}$, or $Cu_{1-z}(Ba_{1-w}Sr_w)_2 Ca_{x-1}Cu_xO_{2x+4-n}$, a copper-based high temperature superconductor having a short c-axis and apt to form vacancies of Cu, is used as a matrix. In the composition indicated, w is a numerical value of 0–1 in the desired composition shown in the aforementioned formula (3), but it is a slightly larger value. As will be mentioned later, ions such as Cu ions are added to any of those matrices to decrease vacancies of Cu and O, perform stabilization of the structure and optimization of the carrier concentration, and increase the superconducting bonds between the unit lattices, thereby realizing a low anisotropy, high temperature superconductor. Also, the number (x) of layers of copper and the carrier concentration are optimized to raise the superconducting transition temperature Tc. Furthermore, the CuO layer between the adjacent Ba—O layers is rendered superconductive to reinforce the bonds between the $Ca_{x-1}Cu_xO_{2x}$ superconducting blocks, reduce the anisotropy of superconductivity and increase the coherence length in the c-axis direction, thereby increasing the critical current density under a magnetic field.

The above and other objects, effects, features and advantages of the present invention will become more apparent from the following description of embodiments thereof taken in conjunction with the accompanying drawings.

DETAILED DESCRIPTION OF PREFERRED EMBODIMENTS

In the following examples are described preferred embodiments of the present invention. However, these embodiments are intended to illustrate the invention, and are not to be construed to limit it.

EXAMPLE 1

Sintered samples of the composition $Ba_2Ca_{x-1}Cu_xO_{2x+1}$ of the aforementioned formula (1) but excluding M were prepared with x being varied in the range of from 3 to 6. AgO or $Ag_2O$ powder was added to form charges of the composition $AgBa_2Ca_{x-1}Cu_xO_{2x+1+r}$ (r=0.5 or 1). These charges were each sealed in an Au or Pt capsule, and treated for 0.5 to 5 hours at a high pressure of 1 to 6 GPa and a high temperature of 800 to 1,200° C. As a result, superconductors with superconducting transition temperatures, Tc, of 110 K or more were obtained.

Figure 1:
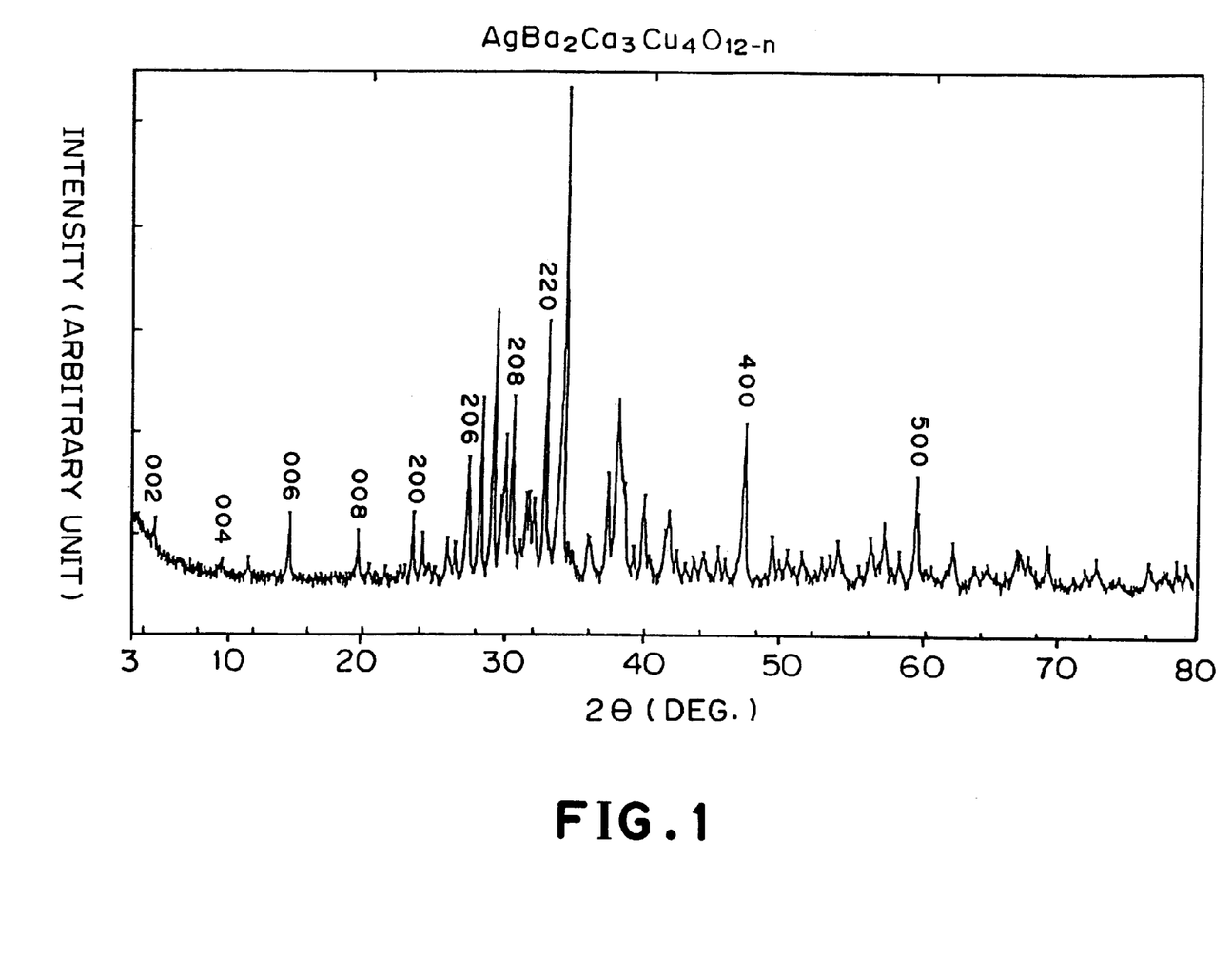
FIG. 1 is a graph showing the X-ray diffraction pattern of an Ag-1234 sample, $AgBa_2Ca_3Cu_4O_{12-n}$ (n=0 to 4), an embodiment of a high temperature superconductor according to the present invention.
Figure 2:
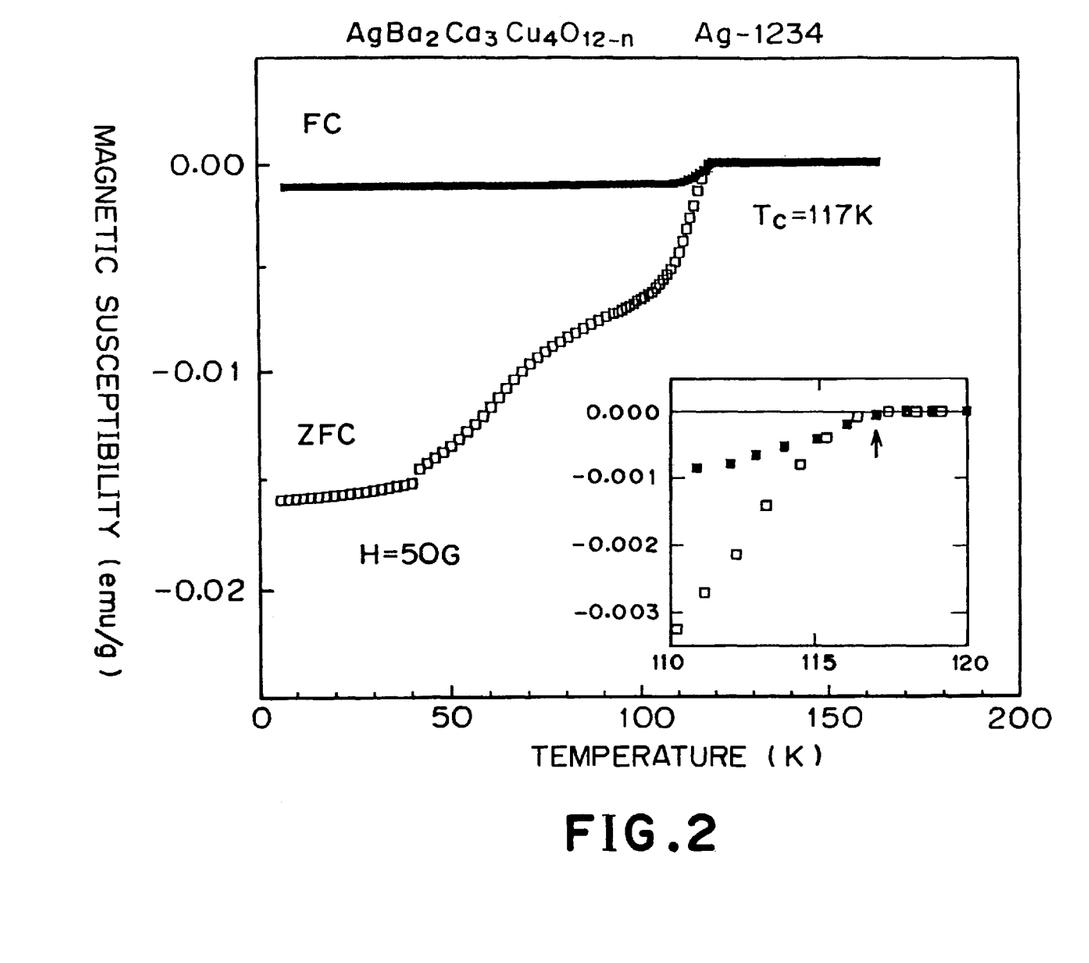
FIG. 2 is a characteristic graph showing the temperature dependence of the magnetic susceptibility of the Ag-1234 sample.
Figure 3:
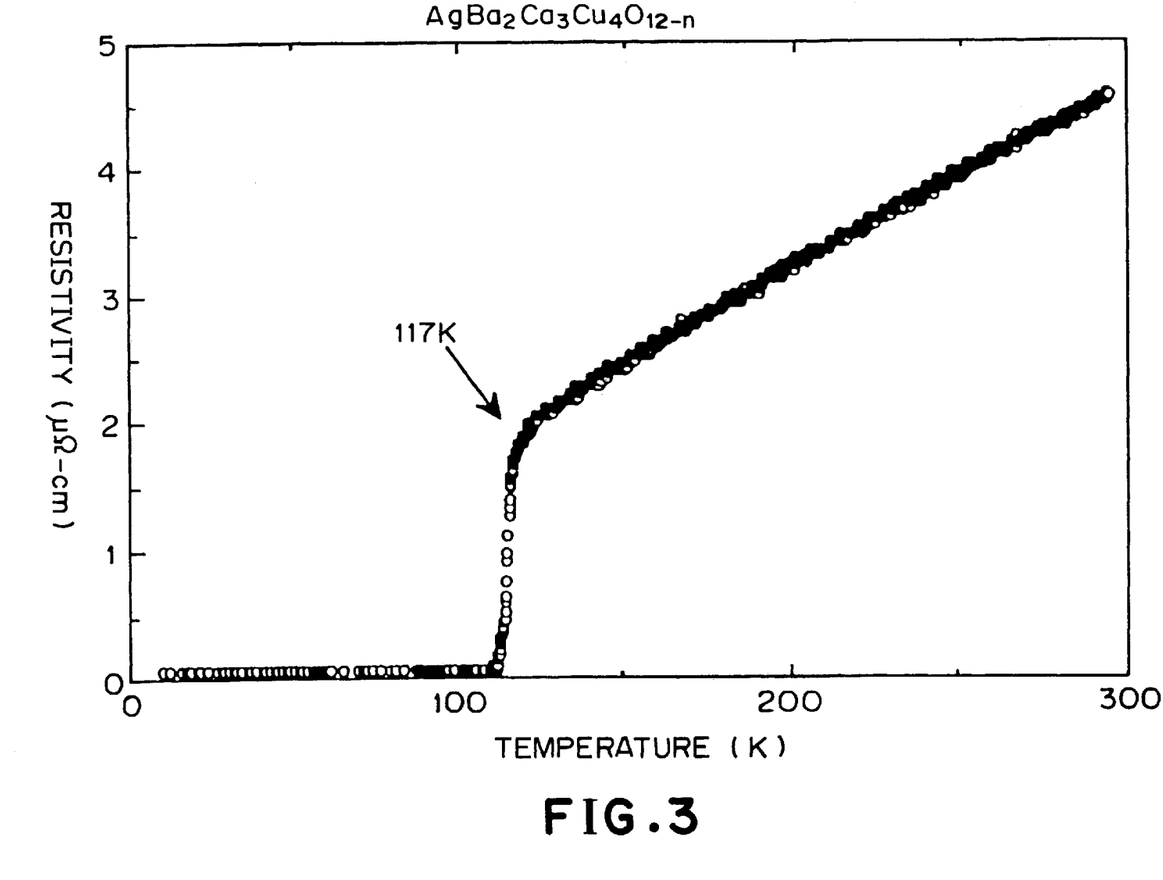
FIG. 3 is a characteristic graph showing the temperature dependence of the electrical resistance of the Ag-1234 sample.

The X-ray diffraction pattern of a sample of the resulting substances was obtained for identification, and is shown in FIG. 1. This is a sample with x=4. The composition of the resulting superconductor was identified as $(Ag,Cu)Ba_2Ca_3Cu_4O_{12-n}$ (n=0 to 4). This sample is designated as Ag-1234. This designation is done in order to distinguish this sample from Cu-1234 sample which contains no Ag. In identifying the composition, the space group represented by the Hermann-Mauguin's symbol was approximatively expressed as P4/mmm. As the X-ray diffraction pattern shows, the number of copper layers of this superconductor sample is 4. FIG. 2 is a graph showing the temperature dependence of the magnetic susceptibility $\chi$ of the Ag-1234 superconductor. As illustrated there, the magnetic susceptibility $\chi$ begins to decrease at 117 K. FIG. 3 shows the temperature dependence of the electrical resistance of this sample. The measurements of the electrical resistance also show the superconducting transition temperature Tc=117 K.

EXAMPLE 2

Sintered samples of the composition $Sr_2Ca_{x-1}Cu_xO_{2x+1}$ were prepared with x being varied in the range of from 3 to 6. AgO or $Ag_2O$ powder was added to form charges of as similar a composition as possible to the composition $AgSr_2Ca_{x-1}Cu_xO_{2x+1+r}$ (r=0.5 or 1). As in EXAMPLE 1, these charges were each sealed in an Au or Pt capsule, and treated for 0.5 to 5 hours at a high pressure of 1 to 6 GPa and a high temperature of 800 to 1,200° C. As a result, superconductors with superconducting transition temperatures, Tc, of 110 K or more were obtained.

EXAMPLE 3

Powdery samples of the composition $Ba_2Ca_{x-1}Cu_xO_{2x-1}$ and the composition $Ba_2Ca_{x-1}Cu_{x+1}O_{2x+2}$ were prepared with x being adjusted in the range of from 2 to 6. To each of the samples was added $CaO_2$ or $BaO_2$ powder so that the average valence of Cu would be 2.3, thereby forming charges of as similar a composition as possible to the composition $CuBa_2Ca_{x-1}Cu_xO_{12-n}$ (n=0 to 4). As in EXAMPLE 1, these charges were each sealed in an Au or Pt capsule, and treated for 0.5 to 5 hours at a high pressure of 1 to 6 GPa and a high temperature of 800 to 1,200° C. As a result, superconductors with superconducting transition temperatures, Tc, of 110 K or more were obtained.

Figure 4:
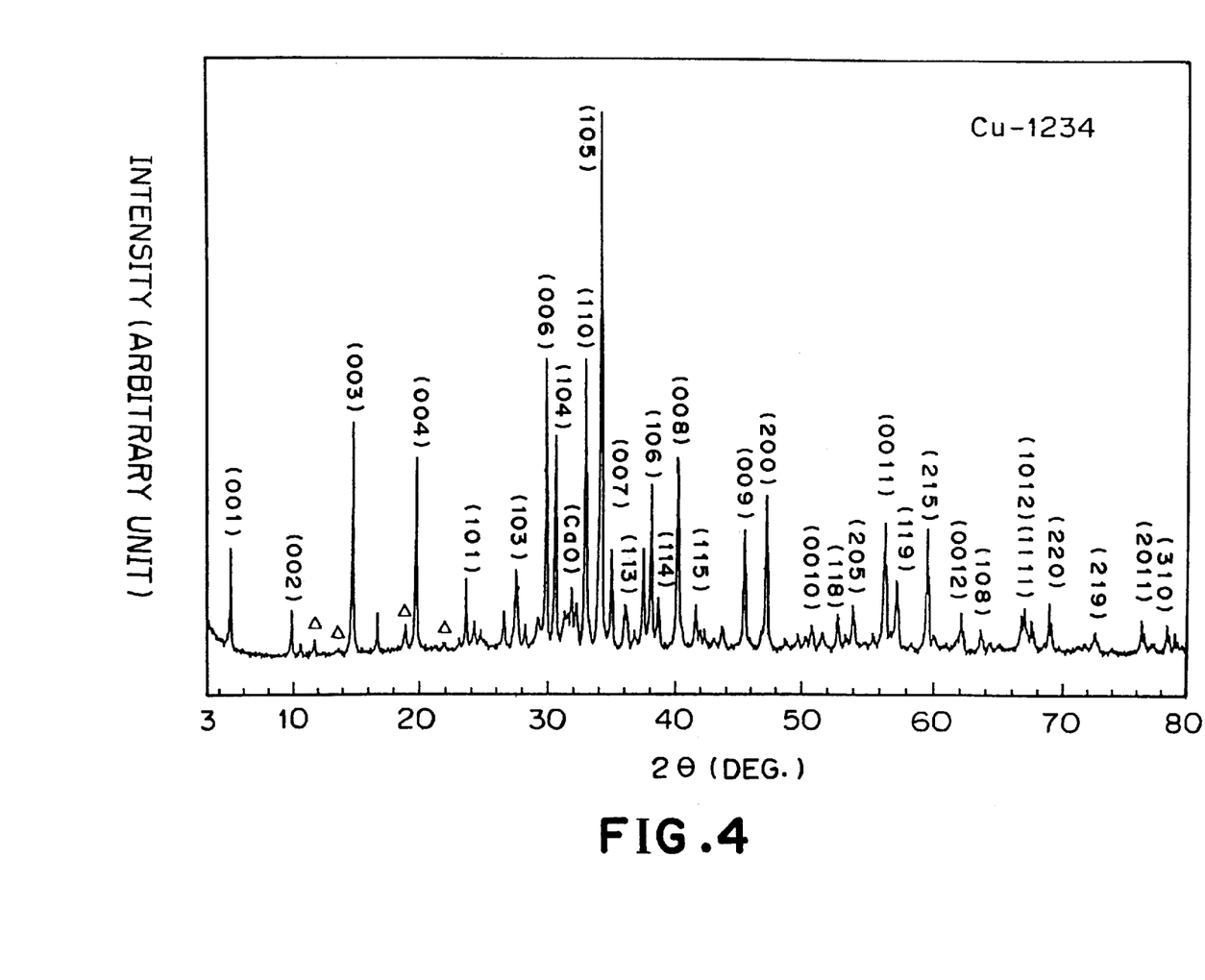
FIG. 4 is a graph showing the X-ray diffraction pattern of a Cu-1234 sample, $CuBa_2Ca_3Cu_4O_{12-n}$ (n=0 to 4), an embodiment of a high temperature superconductor according to the present invention.
Figure 5:
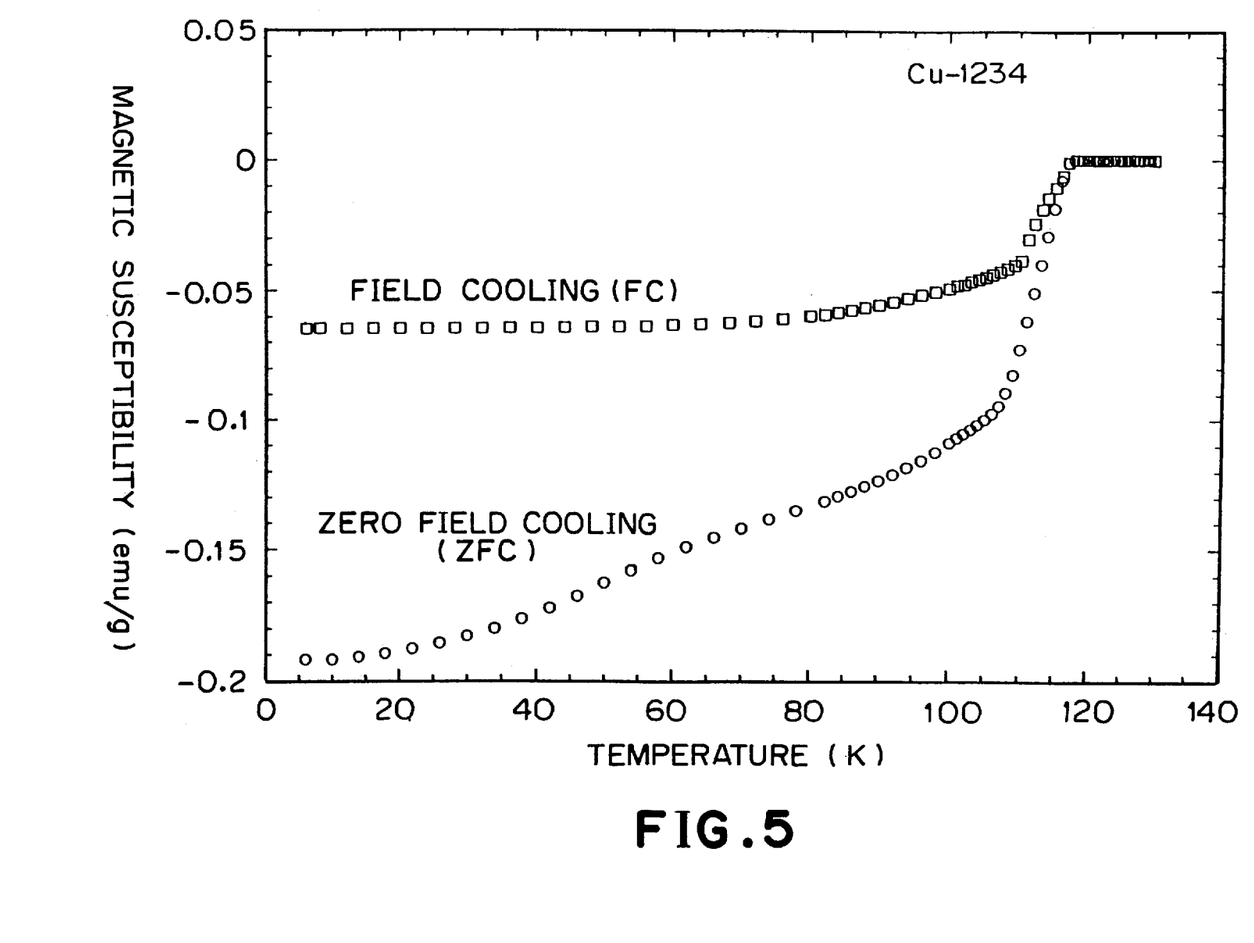
FIG. 5 is a characteristic graph showing the temperature dependence of the magnetic susceptibility of the Cu-1234 sample.
Figure 6:
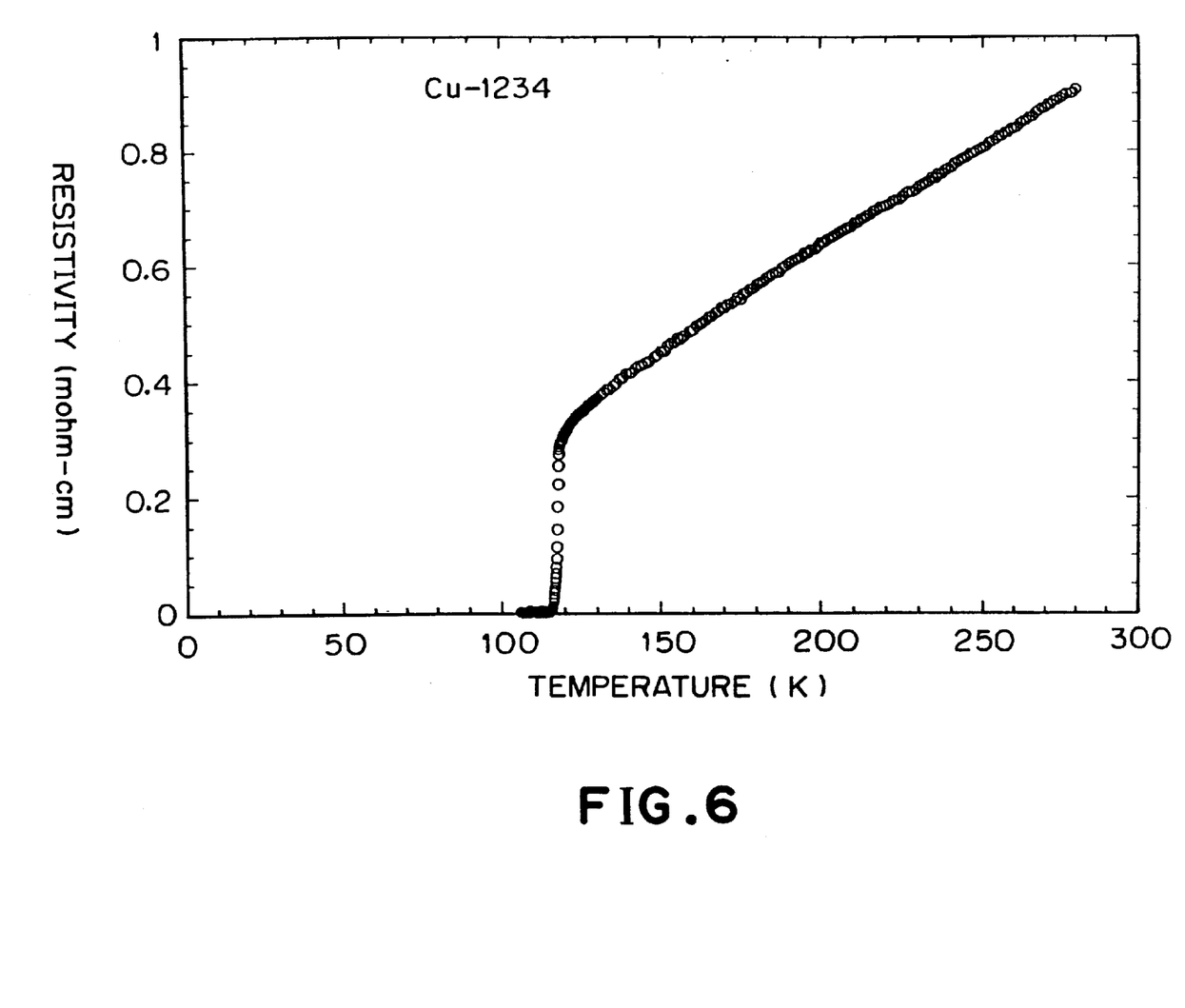
FIG. 6 is a characteristic graph showing the temperature dependence of the electrical resistance of the Cu-1234 sample.

The X-ray diffraction pattern of a sample of the resulting substances was obtained for identification, and is shown in FIG. 4. Based on this X-ray diffraction pattern, the composition of the resulting superconductors was identified as $CuBa_2Ca_3Cu_4O_{12-n}$ (n=0 to 4). This sample is designated as Cu-1234. In identifying the composition, the space group represented by the Hermann-Mauguin's symbol was approximatively expressed as P4/mmm. FIG. 5 is a graph showing the temperature dependence of the magnetic susceptibility $\chi$ of the Cu-1234 superconductor. As illustrated there, the magnetic susceptibility $\chi$ begins to decrease at 116 K. FIG. 6 shows the temperature dependence of the electrical resistance of this sample. The measurements of the electrical resistance also show the superconducting transition temperature Tc=116 K or more.

Figure 7:
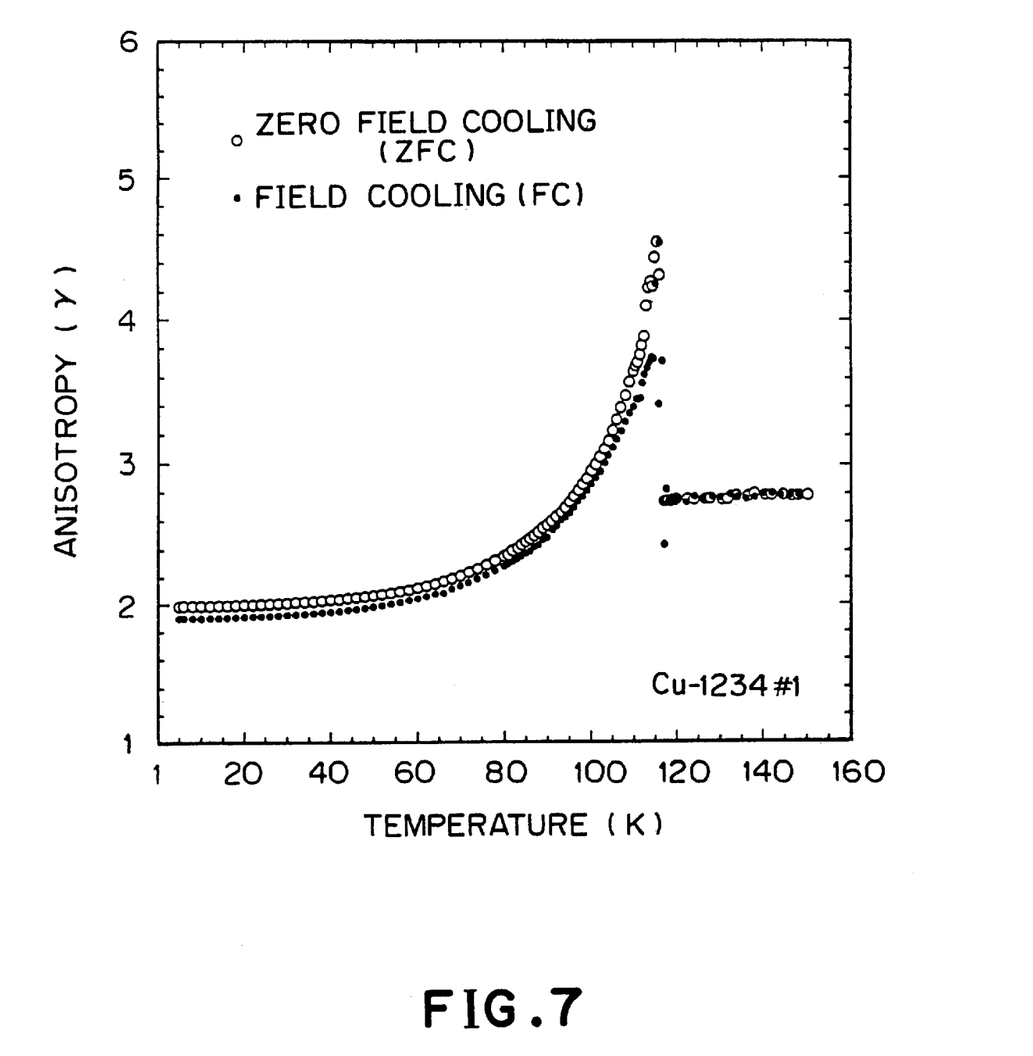
FIG. 7 is a characteristic graph showing the temperature dependence of the superconducting properties of the Cu-1234 sample.

The anisotropy of the superconducting properties of the thus obtained $CuBa_2Ca_3Cu_4O_{12-n}$ sample was $\gamma$=1.3 to 2.5, the lowest value compared with those of conventional copper oxide superconductors. FIG. 7 shows the temperature dependence of the anisotropy $\gamma$ of this sample. In the drawing, data under cooling in a magnetic field (FC) and under cooling in zero magnetic field (ZFC) are revealed. At 100 K or less, especially, at 80 K or less, the anisotropy $\gamma$ is close to 2. The coherence length in the c-axis direction of this sample was about 10 Å, the largest length compared with those of conventional copper oxide superconductors. The critical current density Jc under a high magnetic field was as high as $10^5$ A/cm² at a magnetic field of 1 T and a temperature of 77 K.

EXAMPLE 4

$ReO_3$ or $Re_2O_7$ was added to the constitution of EXAMPLE 3 to enable the treating temperature to be lowered. Charges of the composition $(Cu_{1-z}Re_z)Ba_2Ca_3Cu_4O_{12-n}$ (z=0 to 0.5) were used for production in the same way as in EXAMPLE 1. Low anisotropy, high temperature superconductors with a superconducting transition temperature, Tc, of 116 K and anisotropy $\gamma$ of 3 to 4 were obtained.

EXAMPLE 5

To powered samples of the composition $Sr_2Ca_{x-1}Cu_{x+1}O_{2x+2}$ (x=2 to 6) was added AgO or $Ag_2O$ powder to form samples of the charging composition $(Ag,Cu)Sr_2Ca_{x-1}u_xO_{2x+4-n}$ (n=0 to 4). As in EXAMPLE 1, these samples were sealed in an Au or Pt capsule, and treated for 0.5 to 5 hours at a high pressure of 1 to 6 GPa and a high temperature of 800 to 1,200° C. As a result, superconductors with superconducting transition temperatures, Tc, of 110 K or more were obtained.

EXAMPLE 6

Figure 8:
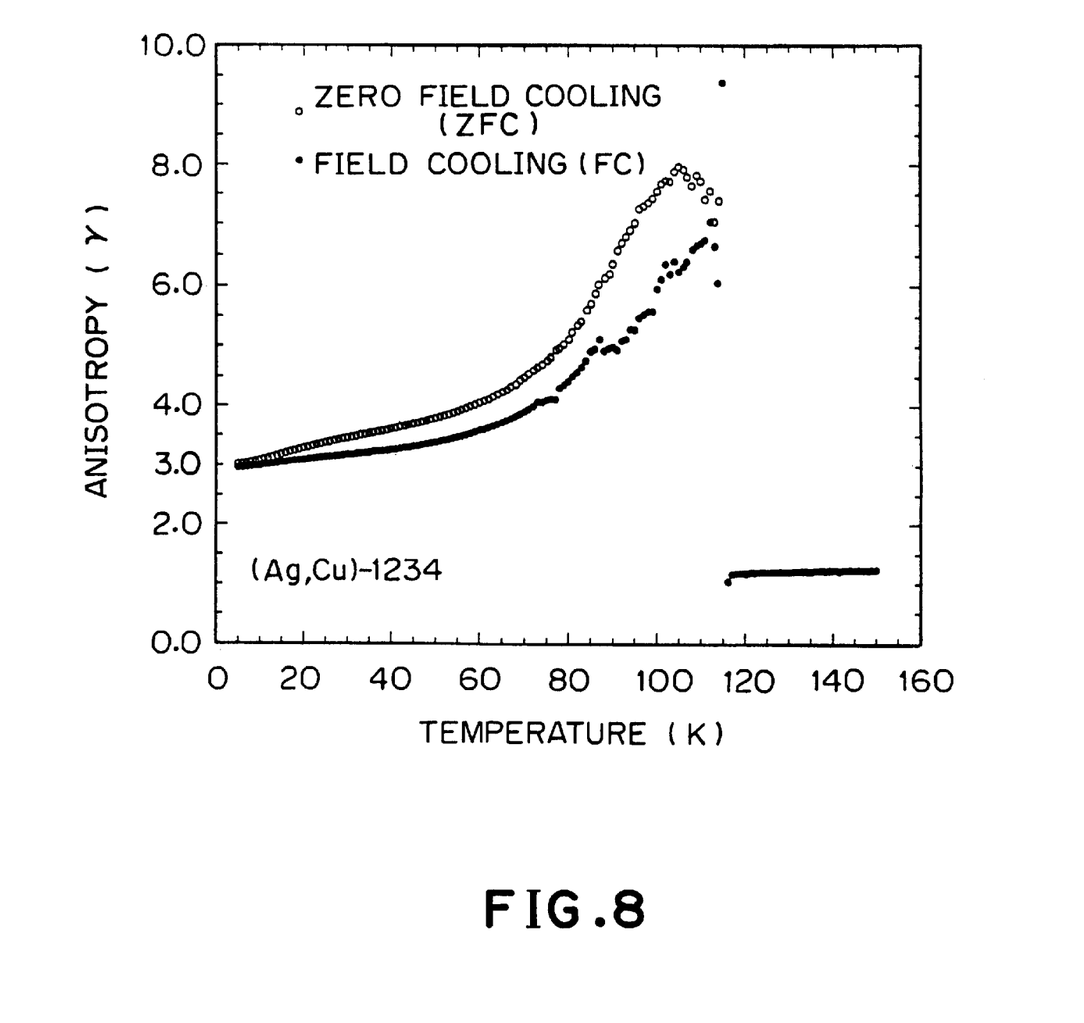
FIG. 8 is a characteristic graph showing the temperature dependence of the superconducting properties of an (Ag, Cu)-1234 sample.

When AgO or $Ag_2O$ powder was added in the constitution of EXAMPLE 3, there were obtained low anisotropy, high temperature superconductors of the composition $(Ag_{1-z}Cu_z)Sr_2Ca_3Cu_4O_{12-n}$ (n=0 to 4) having a superconducting transition temperature Tc=117 K and anisotropy of superconducting properties $\gamma$=up to 3. FIG. 8 shows the temperature dependence of the anisotropy of the resulting sample, (Ag, Cu)-1234.

As described above, the present invention can provide a superconductor having a superconducting transition temperature of 110 K or more and free from Tl or Hg or having a low Tl or Hg content, a superconductor that has been unfeasible.

The present invention can also provide a superconductor having a high critical current density, Jc, at a high magnetic field, low anisotropy of superconducting properties, and a superconducting transition temperature of 110 K or more, a superconductor that has been nonexistent.

The present invention has been described in detail with respect to the preferred embodiments, and it will now be clear that changes and modifications may be made without departing from the invention in its broader aspects. It is our intention, therefore, in the appended claims to cover all such changes and modifications as fall within the true spirit of the invention.

What is claimed is:

1. A high temperature superconductor which has a layered crystal structure, which has a superconducting transition temperature, Tc, of 110 K or more, and which has a composition expressed by:

where M' is at least one element selected from the group consisting of (a) trivalent ions of Tl, and (b) polyvalent ions of Mo, W, and Re, where Ae is at least one of Ba and Sr, where x ranges from 1 to 10, where y ranges from 2x+1 to 2x+4, and where z ranges from $0 < z \leq 0.5$.

2. The high temperature superconductor as claimed in claim 1, wherein the crystal structure has a $CuO_2$ plane having an intrafacial direction, wherein $\xi ab$ denotes a coherence length in the intrafacial direction of the $CuO_2$ plane (ab plane) in the crystal structure, wherein $\xi c$ denotes a coherence length in a direction perpendicular to the $CuO_2$ plane (c-axis direction), and wherein the high temperature superconductor has an anisotrophy $\gamma$ of superconducting properties expressed as $\xi ab/\xi c$ which is 5 or less.

3. A high temperature superconductor which has a layered crystal structure, which has a superconducting transition temperature, Tc, of 110 K or more, and which has a composition expressed by:

$$Cu_{1-z}M'_zAe_2Ca_{x-1}Cu_xO_y,$$

where M' is a polyvalent ion of Re,
where Ae is Ba,
where x ranges from 2 to 6,
where y ranges from 2x+1 to 2x+4, and
where z ranges from $0<z\leq0.5$, wherein the crystal structure has a $CuO_2$ plane having an intrafacial direction, wherein $\xi ab$ denotes a coherence length in the intrafacial direction of the $CuO_2$ plane (ab plane) in the crystal structure, wherein $\xi c$ denotes a coherence length in a direction perpendicular to the $CuO_2$ plane (c-axis direction), and wherein the high temperature superconductor has an anisotrophy $\gamma$ of superconducting properties expressed as $\xi ab/\xi c$ which is 5 or less.

4. The high temperature superconductor as claimed in claim 3, wherein the high temperature superconductor has a composition expressed substantially as $(Cu,Re)Ba_2Ca_3Cu_4O_{12-n}$, where n ranges from 0 to 4.

* * * * *